(12) United States Patent
Sadaka et al.

(10) Patent No.: US 8,673,733 B2
(45) Date of Patent: Mar. 18, 2014

(54) METHODS OF TRANSFERRING LAYERS OF MATERIAL IN 3D INTEGRATION PROCESSES AND RELATED STRUCTURES AND DEVICES

(75) Inventors: Mariam Sadaka, Austin, TX (US); Ionut Radu, Crolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/246,580

(22) Filed: Sep. 27, 2011

(65) Prior Publication Data

US 2013/0075868 A1 Mar. 28, 2013

(51) Int. Cl.
*H01L 21/762* (2006.01)

(52) U.S. Cl.
USPC ............. 438/406; 257/E29.25; 257/E29.251; 257/E21.211; 438/185; 438/251; 438/458; 438/466

(58) Field of Classification Search
USPC ............. 438/455, 458, 459, 5, 185, 251, 406, 438/464; 257/E29.25, E29.251, 58, 758, 257/E21.21, 29.25
See application file for complete search history.

(56) References Cited

U.S. PATENT DOCUMENTS

| | | | | |
|---|---|---|---|---|
| 5,374,564 | A * | 12/1994 | Bruel | 438/455 |
| 5,728,231 | A * | 3/1998 | Negami et al. | 148/33 |
| 6,020,252 | A * | 2/2000 | Aspar et al. | 438/458 |
| 6,103,597 | A | 8/2000 | Aspar et al. | |
| 6,303,468 | B1 | 10/2001 | Aspar et al. | |
| 6,335,258 | B1 * | 1/2002 | Aspar et al. | 438/406 |
| 6,429,104 | B1 * | 8/2002 | Auberton-Herve | 438/527 |
| 6,756,286 | B1 | 6/2004 | Moriceau et al. | |
| 6,809,044 | B1 * | 10/2004 | Aspar et al. | 438/120 |
| 6,946,365 | B2 | 9/2005 | Aspar et al. | |
| RE39,484 | E | 2/2007 | Bruel | |
| 7,615,463 | B2 * | 11/2009 | Aspar et al. | 438/458 |
| 7,772,087 | B2 * | 8/2010 | Nguyen et al. | 438/458 |
| 2001/0007789 | A1 * | 7/2001 | Aspar et al. | 438/458 |
| 2003/0162367 | A1 * | 8/2003 | Roche | 438/460 |
| 2007/0037363 | A1 | 2/2007 | Aspar et al. | |
| 2010/0112825 | A1 | 5/2010 | Cherekdjian et al. | |
| 2011/0045611 | A1 | 2/2011 | Castex et al. | |

FOREIGN PATENT DOCUMENTS

| | | |
|---|---|---|
| EP | 0801419 A1 | 10/1997 |
| WO | 2007017763 A2 | 2/2007 |

OTHER PUBLICATIONS

French Preliminary Search Report and Written Opinion for French Application No. 1159358 dated Jun. 8, 2012, 6 pages.
Gatzen et al., Chemical-Mechanical Planarization of an SU-8/Copper Combination for MEMS, Proc. ASPE 18th Ann. Meet. 2003, Portland, OR, USA, (2003) 4 pages.
McMahon et al., CMP Compatibility of Partially Cured Benzocyclobutene (BCB) for a Via-First 3D IC Process, 2005 MRS Spring Meeting, MRS Proceedings, vol. 867 (2005) 6 pages.

* cited by examiner

*Primary Examiner* — Marc Armand
*Assistant Examiner* — Steven H Assadi
(74) *Attorney, Agent, or Firm* — TraskBritt

(57) ABSTRACT

Methods of transferring a layer of semiconductor material from a first donor structure to a second structure include forming a generally planar weakened zone within the first donor structure defined by implanted ions therein. At least one of a concentration of the implanted ions and an elemental composition of the implanted ions may be formed to vary laterally across the generally planar weakened zone. The first donor structure may be bonded to a second structure, and the first donor structure may be fractured along the generally planar weakened zone, leaving the layer of semiconductor material bonded to the second structure. Semiconductor devices may be fabricated by forming active device structures on the transferred layer of semiconductor material. Semiconductor structures are fabricated using the described methods.

26 Claims, 11 Drawing Sheets

METHODS OF TRANSFERRING LAYERS OF MATERIAL IN 3D INTEGRATION PROCESSES AND RELATED STRUCTURES AND DEVICES

TECHNICAL FIELD

The present disclosure relates to methods of transferring material from a donor structure to a recipient structure in three-dimensional (3D) integration processes employed in semiconductor device fabrication.

BACKGROUND

Three-dimensional (3D) integration of two or more semiconductor structures can produce a number of benefits in microelectronic applications. For example, 3D integration of microelectronic components can result in improved electrical performance and power consumption while reducing the area of the device footprint. See, for example, P. Garrou, et al., "The Handbook of 3D Integration," Wiley-VCH (2008). The 3D integration of semiconductor structures may take place by the attachment of a semiconductor die to one or more additional semiconductor dice (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

The process known in the art as the SMARTCUT® process is used in monolithic 3D integration processes. The SMARTCUT® process is described in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosures of which are incorporated herein in their entireties by this reference.

Briefly, the SMARTCUT® process involves implanting a plurality of ions (e.g., one or more of hydrogen, helium, or inert gas ions) into a donor structure along an ion implant plane. The implanted ions along the ion implant plane define a plane of weakness within the donor structure, along which the donor structure subsequently may be cleaved or otherwise fractured. As known in the art, the depth at which the ions are implanted into the donor structure is at least partially a function of the energy with which the ions are implanted into the donor structure. Generally, ions implanted with less energy will be implanted at relatively shallower depths, while ions implanted with higher energy will be implanted at relatively deeper depths.

The donor structure is bonded to another recipient structure, after which the donor structure is cleaved or otherwise fractured along the ion implant plane. For example, the bonded donor and recipient structures may be heated to cause the donor structure to cleave or otherwise fracture along the ion implant plane. Optionally, mechanical forces may be applied to the donor structure to assist in the cleaving of the donor structure along the ion implant plane. After the donor structure has been cleaved or otherwise fractured along the ion implant plane, a portion of the donor structure remains bonded to the recipient structure. A remainder of the donor structure may be reused in further SMARTCUT® processes to transfer additional portions of the donor structure to recipient structures.

After the fracturing process, the fractured surfaces of the donor structure may include ion impurities and imperfections in the crystal lattice of the donor structure, which, in some applications, may comprise a single crystal of semiconductor material. The portion of the donor structure that is transferred to the recipient structure may be treated in an effort to reduce impurity levels and improve the quality of the crystal lattice (i.e., reduce the number of defects in the crystal lattice proximate the fractured surface) in the transferred portion of the donor structure. Such treatments often involve thermal annealing at elevated temperatures of, for example, about 1,000° C.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes methods of transferring a layer of semiconductor material from a first donor structure to a second structure. In accordance with such methods, ions may be implanted into the first donor structure to form a generally planar weakened zone within the first donor structure defined by the implanted ions. The generally planar weakened zone may separate the layer of semiconductor material of the first donor structure from a remainder of the first donor structure. At least one of a concentration of the implanted ions and an elemental composition of the implanted ions may be formed to vary across the generally planar weakened zone in at least one direction parallel to the generally planar weakened zone. The first donor structure may be bonded to a second structure, and the first donor structure may be fractured along the generally planar weakened zone, leaving the layer of semiconductor material bonded to the second structure.

In additional embodiments, the present disclosure includes methods of fabricating semiconductor devices. In accordance with such methods, a layer of semiconductor material may be transferred from a first donor structure to a second structure. Transferring the layer of semiconductor material may include implanting ions into the first donor structure to form a generally planar weakened zone within the first donor structure defined by the implanted ions, bonding the first donor structure to the second structure, and fracturing the first donor structure along the generally planar weakened zone, leaving the layer of semiconductor material bonded to the second structure. The generally planar weakened zone formed within the first donor structure may separate the layer of semiconductor material of the first donor structure from a remainder of the first donor structure. Additionally, the generally planar weakened zone may be formed such that at least one of a concentration of the implanted ions and an elemental composition of the implanted ions varies across the generally planar weakened zone in at least one direction parallel to the generally planar weakened zone. A plurality of active device structures may be fabricated on the transferred layer of semiconductor material.

In yet further embodiments, the present disclosure includes semiconductor structures fabricated using methods as disclosed herein. For example, semiconductor structures may include a first donor structure having a generally planar weakened zone therein. The generally planar weakened zone may be defined by implanted ions within the first donor structure along the generally planar weakened zone. The generally planar weakened zone may separate a layer of semiconductor material of the first donor structure from a remainder of the first donor structure. Further, at least one of a concentration of the implanted ions and an elemental composition of the implanted ions may vary across the generally planar weakened zone in at least one direction parallel to the generally planar weakened zone. The semiconductor structures may further include a second structure bonded to the layer of semiconductor material of the first donor structure.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

DETAILED DESCRIPTION

The illustrations presented herein are not meant to be actual views of any particular semiconductor structure, device, system, or method, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

In accordance with some embodiments, a method of transferring a layer of material, such as a layer of semiconductor material, from a first donor structure to a second recipient structure includes implanting ions into the first donor structure to form a generally planar weakened zone within the first donor structure defined by the implanted ions. The generally planar weakened zone separates the layer of material to be transferred from the first donor structure from a remainder of the first donor structure. The generally planar weakened zone is inhomogeneous across the generally planar weakened zone in at least one direction parallel to the generally planar weakened zone. For example, at least one of a concentration of the implanted ions and an elemental composition of the implanted ions may vary across the generally planar weakened zone in at least one direction parallel to the generally planar weakened zone. The first donor structure may be bonded to the second recipient structure, after which the first donor structure may be fractured along the generally planar weakened zone and leaving the layer of material bonded to the second recipient structure. Such methods are described in further detail herein below.

Figure 1A:
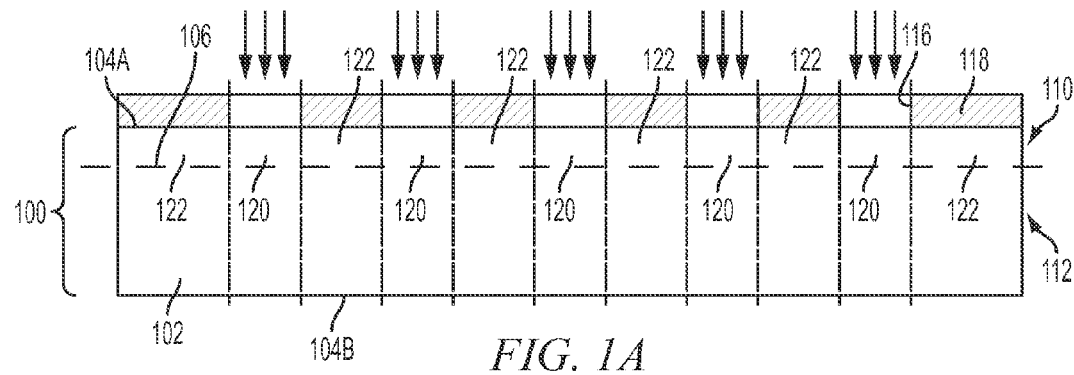
FIGS. 1A through 1F are simplified, schematically illustrated cross-sectional views of donor and/or recipient structures during methods of transferring a layer of semiconductor material from a first donor structure to a second recipient structure in accordance with some embodiments of methods of the disclosure, wherein an inhomogeneous ion implant plane is formed within the donor structure.

FIG. 1A is a simplified, schematically illustrated cross-sectional view of a donor structure 100. The donor structure 100 includes a volume of bulk material 102, which may comprise, for example, a semiconductor material such as silicon, germanium, a III-V semiconductor material (e.g., GaN, GaAs, InN, AlN, InGaN, etc.), or composites of such semiconductor materials. The material 102 may be polycrystalline, or may comprise a single crystal of material. The donor structure 100 may be generally planar and may have a first major surface 104A and an opposing second major surface 104B oriented parallel to the first major surface 104A.

As shown in FIG. 1A, ions (represented by the directional arrows in FIG. 1A) may be implanted into the donor structure 100 only through selected regions of the donor structure 100. The ions may comprise, for example, one or more of hydrogen ions, helium ions, and inert gas ions. The ions may be implanted into the donor structure 100 along an ion implant plane 106. As shown in FIG. 1A, the ions may be implanted into the donor structure 100 through the first major surface 104A in a direction substantially perpendicular to the first major surface 104A.

The depth at which the ions are implanted into the donor structure 100 is at least partially a function of the energy with which the ions are implanted into the donor structure 100.

Figure 1B:
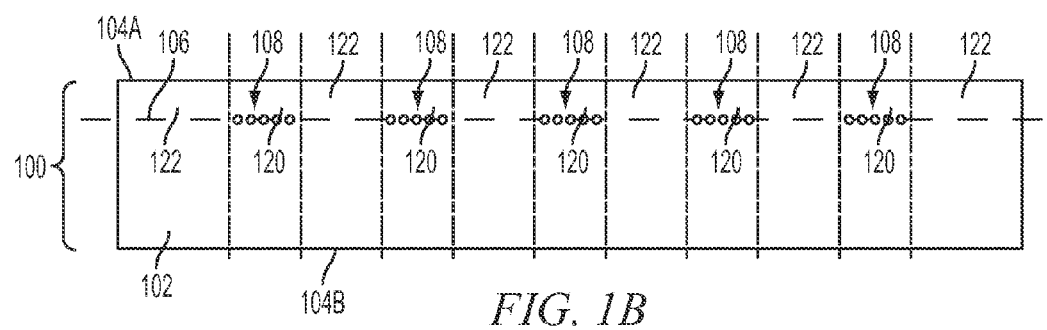

Generally, ions implanted with less energy will be implanted at relatively shallower depths, while ions implanted with higher energy will be implanted at relatively deeper depths. Ions may be implanted into the donor structure 100 with a predetermined energy selected to implant the ions at a desired depth within the donor structure 100 from the first major surface 104A. At least some ions may be implanted at depths other than the desired implantation depth, and a graph of the concentration of the ions within the donor structure 100 as a function of depth into the donor structure 100 from the first major surface 104A may exhibit a generally bell-shaped (symmetric or asymmetric) curve having a maximum at the desired implantation depth, which defines the ion implant plane 106. In other words, the ion implant plane 106 may comprise a layer or region within the donor structure 100 that is aligned with (e.g., centered about) the plane of maximum ion concentration within the donor structure 100. The ion implant plane 106 defines a zone of weakness within the donor structure 100 along which the donor structure 100 may be cleaved or otherwise fractured in a subsequent process, as discussed in further detail below. For example, referring briefly to FIG. 1B, the presence of the ions within the donor structure may create defects 108 within the crystal lattice of the donor structure 100.

A layer of material 110 to be transferred from the donor structure 100 to another recipient structure is defined on one side of the ion implant plane 106, and a remainder 112 of the donor structure 100 is disposed on an opposing side of the ion implant plane 106 from the layer of material 110.

Referring again to FIG. 1A, as previously mentioned, the generally planar weakened zone along the ion implant plane 106 is inhomogeneous across the weakened zone in at least one direction parallel to the ion implant plane 106. For example, at least one of a concentration of the implanted ions and an elemental composition of the implanted ions may vary across the generally planar weakened zone. To form such an inhomogeneous zone of weakness, in some embodiments, ions may be implanted only through selected regions of the donor structure 100. For example, ions may be implanted into the donor structure 100 through apertures 116 in a patterned mask 118. The patterned mask 118 may be formed on the major surface 104A of the donor structure 100, as shown in FIG. 1A, or the patterned mask 118 may be formed separately from the donor structure 100 and simply disposed over the major surface 104A of the donor structure 100 (either directly on the major surface 104A or spaced from the major surface 104A vertically above the major surface 104A).

By implanting the ions into the donor structure 100 through the apertures 116 in the patterned mask 118, ions are implanted only through a first plurality of regions 120 of the layer of material 110, and not through a second plurality of regions 122 of the layer of material 110. The first plurality of regions 120 and the second plurality of regions 122 are delineated in FIGS. 1A and 1B by the vertically oriented dashed lines. Ion implantation into the donor structure 100 through the second plurality of regions 122 is impeded (e.g., precluded) by the material of the mask 118. As previously mentioned, the layer of material 110 may comprise a semiconductor material that will ultimately be used to fabricate active semiconductor device structures (e.g., transistors, capacitors, electrically conductive pathways, etc.) on a recipient structure to which the layer of material 110 is to be transferred. In accordance with some embodiments of the disclosure, the apertures 116 may be selectively formed in the patterned mask 118 such that the apertures 116 are disposed over and vertically aligned with what will be inactive regions of the layer of material 110, and such that active regions of the layer of material 110 are shielded from the ions by the material of the mask 118. In other words, the first plurality of regions 120 of the layer of material 110 may comprise inactive regions of the layer of material 110, and the second plurality of regions 122 may comprise active regions of the layer of material 110.

As used herein, the term "inactive region," when used in relation to a layer of material to be transferred from a donor structure to a recipient structure, means and includes a region that ultimately comprises a passive region within the layer of material in a fully fabricated device that does not include any active device structure therein. As used herein, the term "active region," when used in relation to a layer of material to be transferred from a donor structure to a recipient structure, means and includes a region that ultimately comprises an active region within the layer of material 110 in a fully fabricated device that includes one or more active device structures therein, such as one or more of a transistor, a capacitor, and an electrically conductive pathway.

As described above, ions may be implanted through inactive regions of the layer of material 110 (the first plurality of regions 120) without implanting ions in any substantial quantity through active regions of the layer of material 110 (the second plurality of regions 122). Thus, the generally planar weakened zone defined by the ion implant plane 106 is inhomogeneous across the generally planar weakened zone in at least one direction parallel to the generally planar weakened zone by virtue of the fact that a relatively higher concentration of ions is present within the generally weakened zone adjacent the first plurality of regions 120 relative to the concentration (which may be at least substantially zero) of ions present within the generally weakened zone adjacent the second plurality of regions 122. Embodiments of the present disclosure thus may be used to reduce damage to the active regions (i.e., the second plurality of regions 122) that might be caused by the ion implantation process.

Figure 1C:
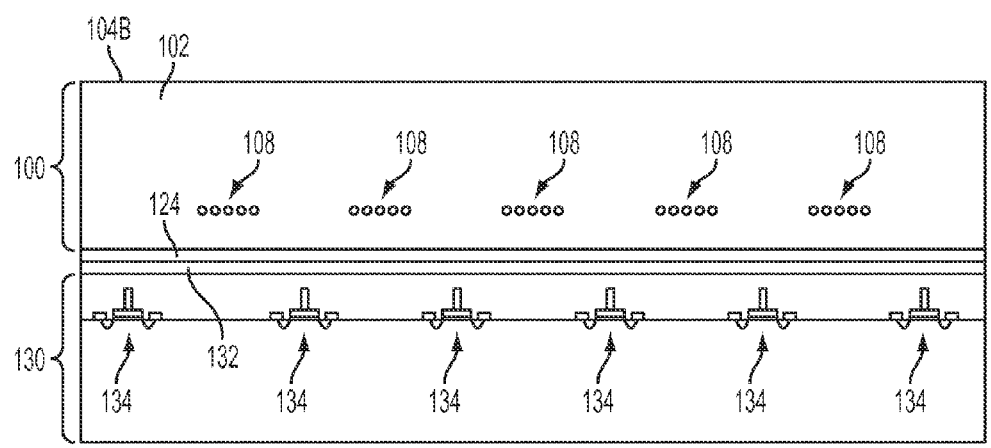

Referring to FIG. 1C, the first major surface 104A (FIG. 1B) of the donor structure 100 (which comprises a surface of the layer of material 110 to be transferred) may be bonded to a recipient structure 130. In some embodiments, the donor structure 100 may be bonded to the recipient structure 130 after implanting the ions into the donor structure 100 as discussed above. In other embodiments, the ions may be implanted into the donor structure 100 through the opposing major surface 104B of the donor structure 100 after bonding the first major surface 104A of the donor structure 100 to the recipient structure 130. It may be relatively more difficult to perform the implantation process after bonding the first major surface 104A of the donor structure 100 to the recipient structure 130, as higher energies may be needed to implant the ions at a desirable depth.

In some embodiments, the donor structure 100 may be directly bonded to the recipient structure 130 using a direct bonding process. So called "direct bonding methods" are methods in which a direct solid-to-solid chemical bond is established between two structures to bond them together without using an intermediate bonding material therebetween. Direct metal-to-metal bonding methods and direct oxide-to-oxide bonding methods have been developed for bonding metal or oxide material at a surface of a first structure to metal or oxide material, respectively, at a surface of a second structure. Such methods are discussed in, for example, P. Garrou, et al., "The Handbook of 3D Integration," Wiley-VCH (2008) Volume 1, Chapter 11.

Thus, if the bulk material 102 of the donor structure 100 and/or the material of the recipient structure 130 at the bonding surface thereof do not comprise a suitable material for such a direct bonding process, a suitable bonding material may be provided at the bonding surfaces of the donor structure 100 and/or the recipient structure 130. For example, FIG. 1C illustrates a bonding material 124 at the bonding surface (the first major surface 104A) of the donor structure 100 and a bonding material 132 at the bonding surface of the recipient structure 130.

The bonding material 124 and the bonding material 132 may have similar compositions, and may comprise, for example, a metal material (e.g., copper, aluminum, titanium, tungsten, nickel, etc. or an alloy of such metals), an oxide material (e.g., silicon oxide), or a semiconductor material (e.g., silicon, germanium, a compound semiconductor material, etc.).

The bonding surfaces of the bonding material 124 and the bonding material 132 may be cleaned to remove surface impurities and surface compounds (e.g., native oxides). Further, the surface roughness of the bonding surfaces may be reduced to increase the area of intimate contact between the bonding surfaces at the atomic scale. The area of intimate contact between the bonding surfaces is generally accomplished by polishing the bonding surfaces to reduce the surface roughness up to values close to the atomic scale, by applying pressure between the bonding surfaces resulting in plastic deformation, or by both polishing the bonding surfaces and applying pressure to attain such plastic deformation.

After preparing the bonding surfaces, they may be brought into intimate contact with one another. The attractive forces between the bonding surfaces are then high enough to cause molecular adhesion (bonding induced by the total of the attractive forces (van der Waals forces) of electronic interaction between atoms and/or molecules of the two surfaces to be bonded). A tool such as a stylus then may be pressed onto the exposed major surface 104B of the donor structure 100 (and/or an exposed major surface of the recipient structure 130) in order to initiate propagation of a bonding wave across the interface between the bonding surfaces of the donor structure 100 and the recipient structure 130. The point at which the tool is applied may, for example, be located at the center or proximate a peripheral edge of the donor structure 100 and/or the recipient structure 130. Such methods are disclosed in, for example, U.S. Patent Application Publication No. US 2011/0045611 A1, which published Feb. 24, 2011 in the name of Castex et al., the disclosure of which is incorporated herein in its entirety by this reference.

Optionally, the donor structure 100 and/or the recipient structure 130 may be heated during the bonding process to assist the bonding process.

The recipient structure 130 may comprise a die or wafer, and, in some embodiments, may include previously fabricated active device structures 134. The active device structures 134 schematically illustrated in FIG. 1C represent transistors, although the active device structures 134 may comprise other types of active device structures such as capacitors, electrically conductive lines, traces, and/or vias, etc. The active device structures 134 may comprise materials or structures that might be detrimentally affected upon being subjected to excessive thermal energy. Thus, in some embodiments, the bonding process may be carried out at temperatures of about 400° C. or less, about 200° C. or less, or even at about room temperature.

Figure 1D:
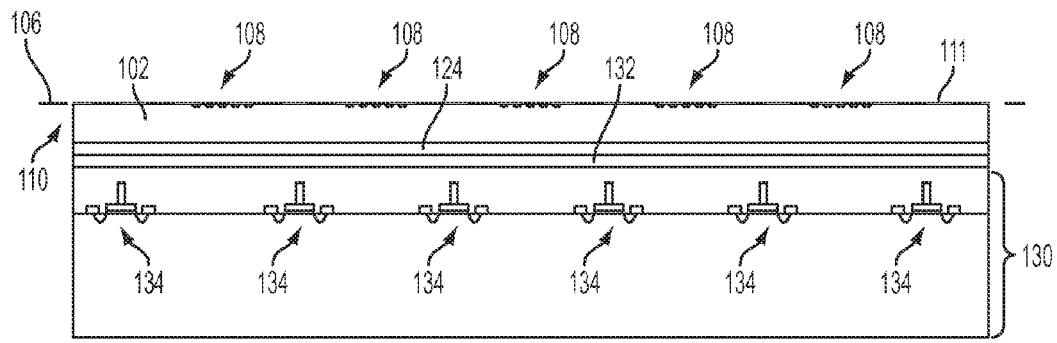

After bonding the donor structure 100 to the recipient structure 130, the donor structure 100 may be cleaved or otherwise fractured along the ion implant plane 106 to form the structure shown in FIG. 1D, which includes the recipient structure 130, the layer of material 110 bonded to the recipient structure 130 with the bonding material 124 and the bonding material 132 therebetween. For example, the donor structure 100 (and, optionally, the recipient structure 130) may be heated to cause the donor structure 100 to cleave or otherwise fracture along the ion implant plane 106. In some embodiments, the temperature of the donor structure 100 and the recipient structure 130 may be maintained at about 500° C. or less, at about 400° C. or less, or even at about 350° C. or less during the fracturing process. Limiting the temperature during the fracturing process may be desirable for purposes of, for example, preventing damage to previously formed active device structures on the recipient structure 130. In other embodiments, however, the cleaving process may be performed at higher temperatures. Optionally, mechanical forces may be applied to the donor structure 100 to cause or assist in the cleaving or other fracturing of the donor structure 100 along the ion implant plane 106.

After the fracturing process, the layer of material 110 remains bonded to the recipient structure 130, and a remainder of the donor structure 100 may be reused to transfer additional layers of material to recipient structures as desirable.

Figure 1E:
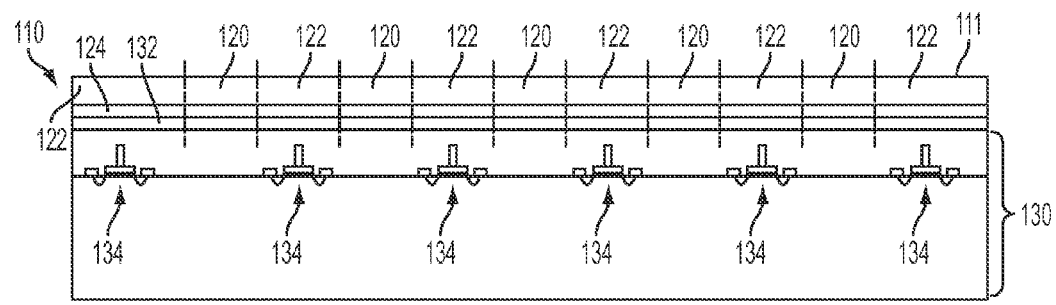

After the fracturing process, the exposed, fractured surface 111 of the layer of material 110 may comprise defects in the crystal lattice of the transferred layer of material 110 and impurities. Further, defects 108 resulting from the implanted ions, as previously described, may be present at the fractured surface 111 adjacent the first plurality of regions 120 (FIG. 1B) of the layer of material 110 through which the ions were implanted. Thus, the fractured surface 111 of the layer of material 110 may be treated to remove impurities (e.g., implanted ions) and to improve the quality of the crystalline lattice within the layer of material 110 proximate the fractured surface 111. For example, the fractured surface 111 may be subjected to one or more of a chemical etching process, a mechanical polishing process, and a chemical-mechanical polishing (CMP) process to form the structure shown in FIG. 1E. The structure of FIG. 1E is substantially similar to that of FIG. 1D, but the surface 111 is illustrated as being free of the defects 108 to represent the improved quality of the surface 111 relative to that of FIG. 1D.

The treatment process used to improve the quality of the layer of material 110 proximate the surface 111 may not render the layer of material 110 perfectly free of impurities or of perfect crystalline quality. The quality, however, may be higher in the second plurality of regions 122 (which may comprise active regions) relative to the first plurality of regions 120 (which may comprise inactive regions), since ions were implanted through the first plurality of regions 120 without implanting ions through the second plurality of regions 122.

Figure 1F:
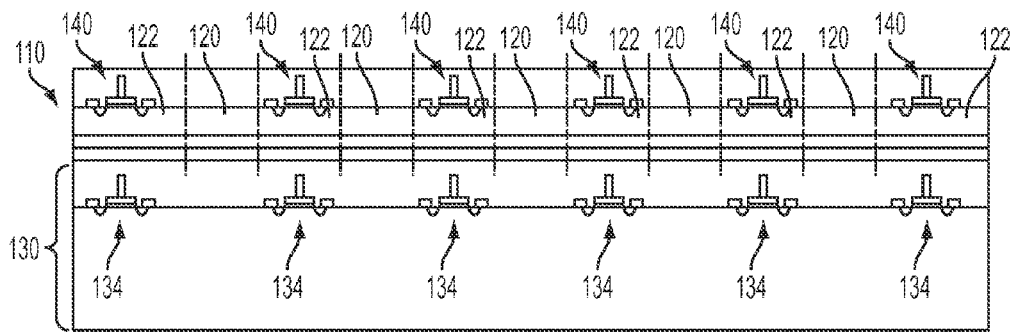

Referring to FIG. 1F, active device structures 140 may be fabricated in and/or on the transferred layer of material 110. The active device structures 140 schematically illustrated in FIG. 1F represent transistors, although the active device structures 140 may comprise other types of active device structures such as capacitors, electrically conductive lines, traces, and/or vias, etc. Further, the active device structures 140 may comprise any of CMOS type transistors, vertical transistors, a diode (e.g., a PN junction), a component of a cross-point memory device (e.g., phase change memory or another type of resistive memory device), etc. Optionally, the active device structures 140 may be fabricated in and/or on the active second plurality of regions 122 without fabricating active device structures 140 in a significant quantity on the inactive first plurality of regions 120, as shown in FIG. 1F. As a result of being fabricated on and/or in a surface 111 of the layer of material 110 of improved quality, the reliability in the performance of the active device structures 140 may be improved.

Subsequent processing may continue in accordance with known methods in order to complete fabrication of one or more semiconductor devices. Such semiconductor devices may comprise, for example, an electronic signal processor device, a memory device, a photoactive device (e.g., a radiation emitting device (such as a laser, a light-emitting diode, etc.)) or a radiation receiving device (such as a photodetector, a solar cell, etc.), a micromechanical device, etc.

One or more of the active device structures 140 may be operationally coupled with one or more of the active device structures 134 of the recipient structure 130 by establishing electrical contact therebetween using one or more of vertically extending conductive vias, conductive pads, and laterally extending conductive lines.

Figure 2A:
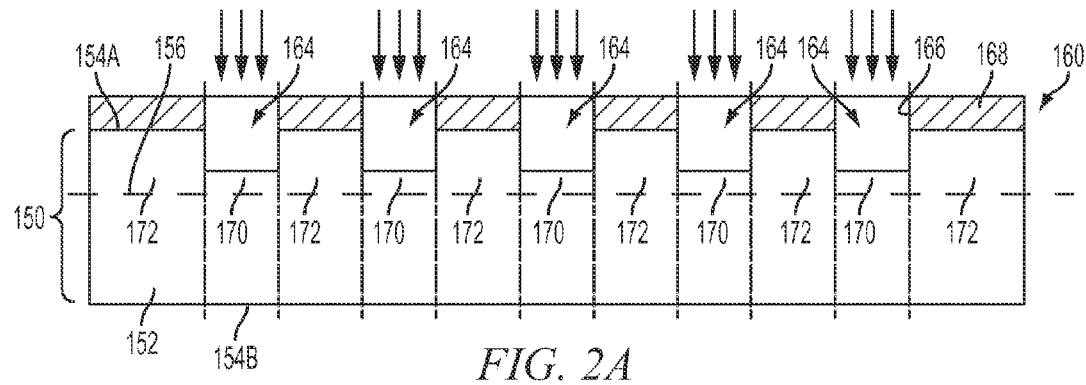
FIGS. 2A through 2G are simplified, schematically illustrated cross-sectional views of donor and/or recipient structures during methods of transferring a layer of semiconductor material from a first donor structure to a second recipient structure in accordance with further embodiments of methods of the disclosure, wherein ions are implanted through selected regions of the donor structure that include recesses formed in the donor structure.

FIGS. 2A through 2G illustrate additional embodiments of methods of the disclosure. FIG. 2A is similar to FIG. 1A and illustrates ions being selectively implanted into a donor structure 150 through a first plurality of regions 170 of a layer of material 160 to be transferred without implanting ions through a second plurality of regions 172 of the layer of material 160 by implanting the ions through apertures 166 in a patterned mask 168. Prior to implanting the ions along an ion implant plane 156 to form the inhomogeneous generally weakened zone, however, a plurality of recesses 164 may be formed into the first major surface 154A of the donor structure 150 in the first plurality of regions 170, as shown in FIG. 2A.

The recesses 164 may be formed in the donor structure 150 using, for example, a masking and etching process. In some embodiments, the same mask 168 used during the ion implantation process may be first used as an etching mask to form the recesses 164. For example, the patterned mask 168 may be formed by depositing an oxide material, a nitride material, or an oxynitride material over the major surface 154A of the donor structure 150. A photolithography process then may be used to form the apertures 166 through the mask 168. For example, a patterned photomask may be deposited over the material used to form the mask 168, and an etching process may be used to etch the apertures 166 in the mask 168 using the patterned photomask, after which the photomask may be removed. The patterned mask 168 then may be used to form the recesses 164 in the donor structure 150, after which the ions may be implanted through the recesses 164 and the first plurality of regions 170 of the layer of material 160 using the mask 168 to shield the second plurality of regions 172 of the layer of material 160 from the ions.

By implanting the ions through the recesses 164, the depth of the ion implant plane 156 into the donor structure 150 from the major surface 154A may be increased. For example, in some embodiments, the ion implant plane 156 may be located approximately 1.5 μm or more from the major surface 154A of the donor structure 150 through which the ions are implanted. Implanting the ions into the donor structure 150 further from the major surface 154A enables the transfer of a relatively thicker layer of material 160 to a recipient structure.

Figure 2B:
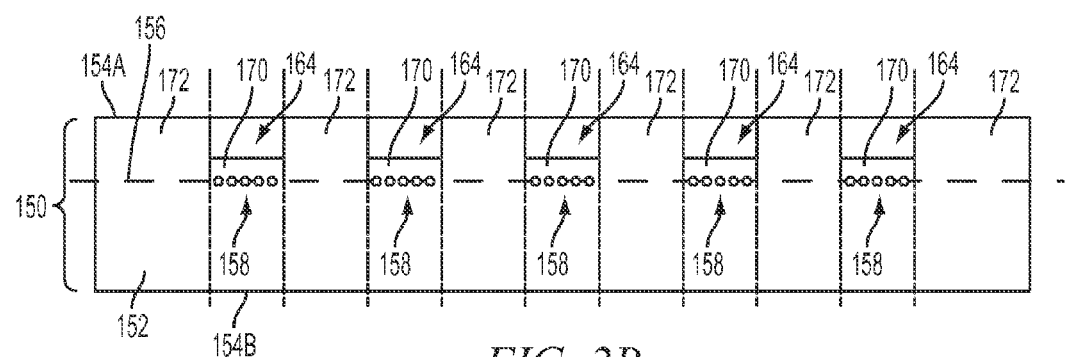

FIG. 2B illustrates the structure after removing the mask 168, and illustrates defects 158 in the donor structure 150 adjacent the first plurality of regions 170 resulting from the ion implantation process.

Figure 2C:
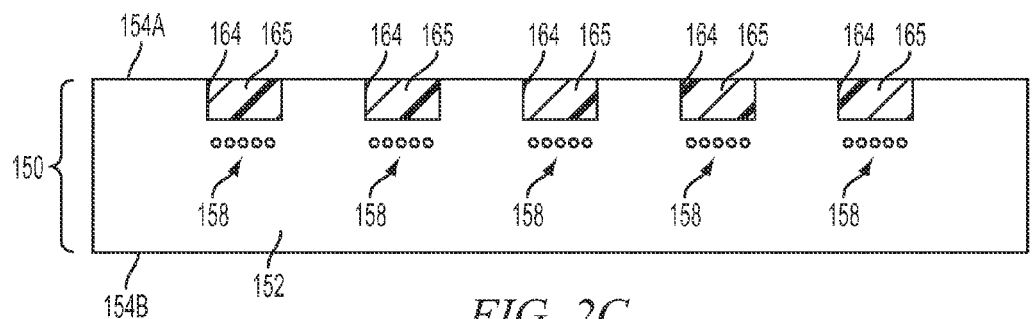

Referring to FIG. 2C, the recesses 164 may be filled with a dielectric material 165. For example, dielectric material may be blanket deposited over the structure of FIG. 2B, after which a chemical-mechanical polishing (CMP) process may be used to remove the excess dielectric material over the major surface 154A of the donor structure 150 outside the recesses 164.

Figure 2D:
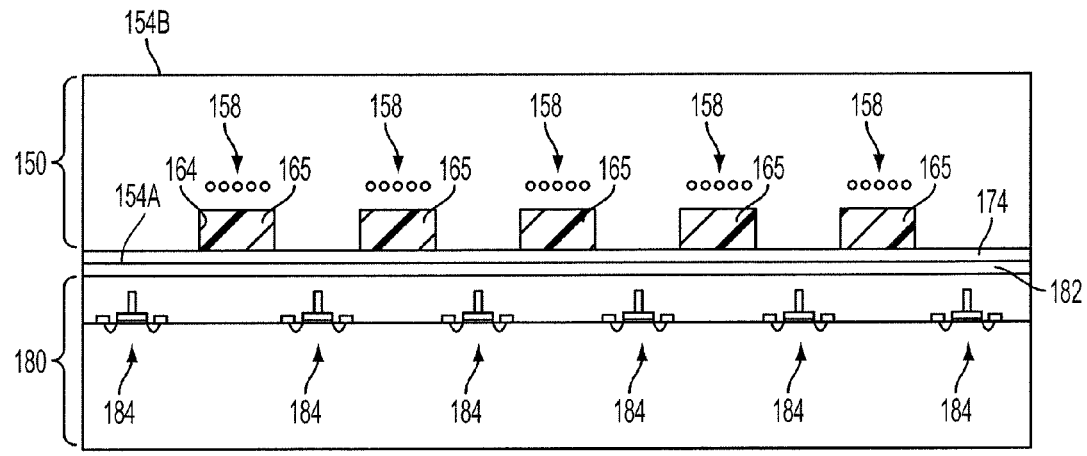

As shown in FIG. 2D, the donor structure 150 may be bonded to a recipient structure 180 in a manner like that previously described with reference to FIG. 1C. The recipient structure 180 may include active device structures 184 in some embodiments. Further, as previously discussed, a bonding material 174 may be provided at the bonding surface (the first major surface 154A) of the donor structure 150, and a bonding material 182 may be provided at the bonding surface of the recipient structure 180. The bonding material 174 and the bonding material 182 may have similar compositions, and may comprise, for example, a metal material (e.g., copper or a copper alloy) or an oxide material (e.g., silicon oxide). A direct metal-to-metal or oxide-to-oxide bond may be established between the abutting surfaces of the bonding material 174 and the bonding material 182 as previously described with reference to FIG. 1C.

Figure 2E:
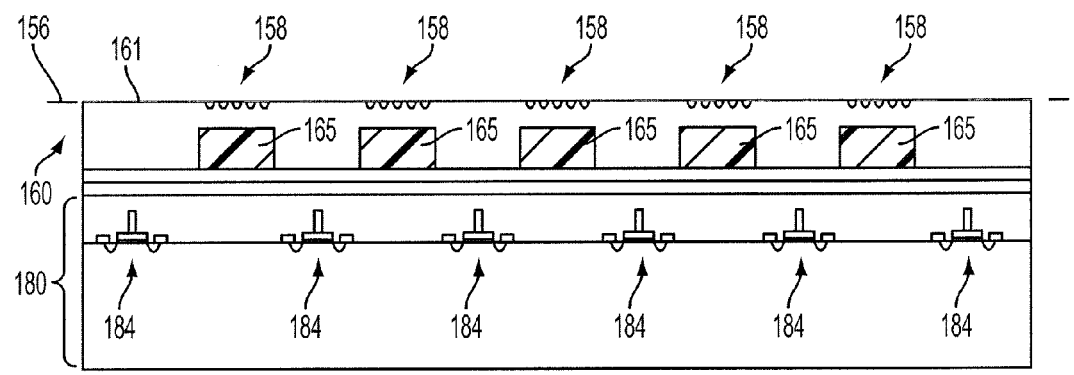
Figure 2F:
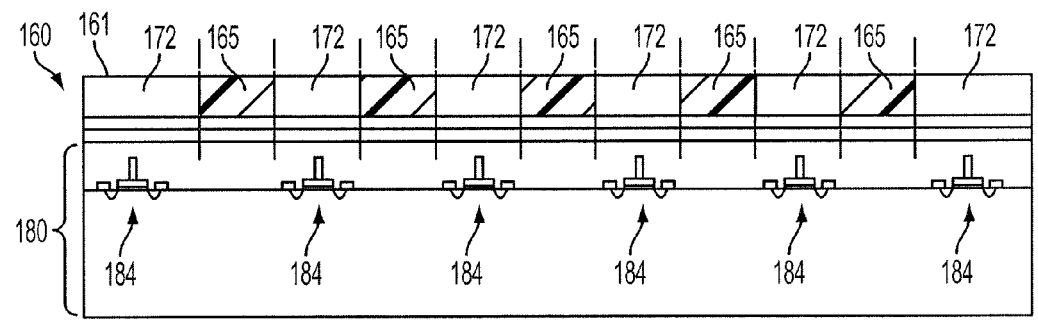

After bonding the donor structure 150 to the recipient structure 180, the donor structure 150 may be cleaved or otherwise fractured along the ion implant plane 156 to form the structure shown in FIG. 2E, which includes the recipient structure 180 and the layer of material 160 bonded to the recipient structure 180. The donor structure 150 may be fractured along the ion implant plane 156 as previously described with reference to FIG. 1D. After the fracturing process, the exposed, fractured surface 161 of the layer of material 160 may comprise defects in the crystal lattice of the transferred layer of material 160 and impurities. Further, defects 158 resulting from the implanted ions, as previously described, may be present at the fractured surface 161 adjacent the first plurality of regions 170 (FIG. 2B) of the layer of material 160 through which the ions were implanted. Thus, the fractured surface 161 of the layer of material 160 may be treated to remove impurities (e.g., implanted ions) and to improve the quality of the crystalline lattice within the layer of material 160 proximate the fractured surface 161. For example, the fractured surface 161 may be subjected to one or more of a chemical etching process, a mechanical polishing process, and a chemical-mechanical polishing (CMP) process to form the structure shown in FIG. 2F. Optionally, the dielectric material 165 may be used as an etch-stop material. In other words, material may be removed from the fractured surface 161 using one or more of a chemical etching process, a mechanical polishing process, and a chemical-mechanical polishing (CMP) process until the volumes of dielectric material 165 become exposed. Thus, the inactive first plurality of regions 170 (FIG. 2B) of the transferred layer of material 160 may be at least substantially removed in some embodiments. Portions of the inactive first plurality of regions 170 (FIG. 2B) of the transferred layer of material 160 could remain in other embodiments. The structure of FIG. 2F is similar to that of FIG. 2E, but the areas of the surface 161 that previously included the defects 158 (FIG. 2E) have been removed.

Figure 2G:
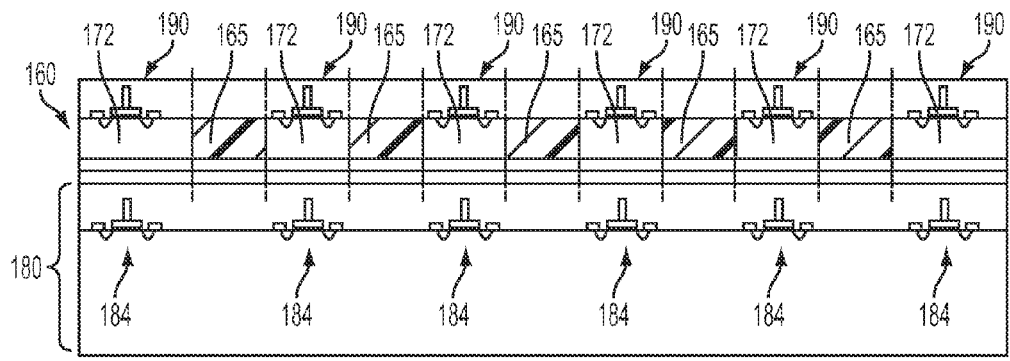

Referring to FIG. 2G, active device structures 190 may be fabricated in and/or on the transferred layer of material 160. The active device structures 190 schematically illustrated in FIG. 2G represent transistors, although the active device structures 190 may comprise other types of active device structures such as capacitors, electrically conductive lines, traces, and/or vias, etc. Further, the active device structures 190 may comprise any of CMOS type transistors, vertical transistors, a diode (e.g., a PN junction), a component of a cross-point memory device (e.g., phase change memory or another type of resistive memory device), etc. Optionally, the active device structures 190 may be fabricated in and/or on the active second plurality of regions 172 without fabricating active device structures 190 in a significant quantity on the inactive first plurality of regions 170 (FIGS. 2A and 2B), as shown in FIG. 2G. As a result of being fabricated on and/or in a surface 161 of the layer of material 160 of improved quality, the reliability in the performance of the active device structures 190 may be improved.

Subsequent processing may continue in accordance with known methods in order to complete fabrication of one or more semiconductor devices, as previously described.

Figure 3A:
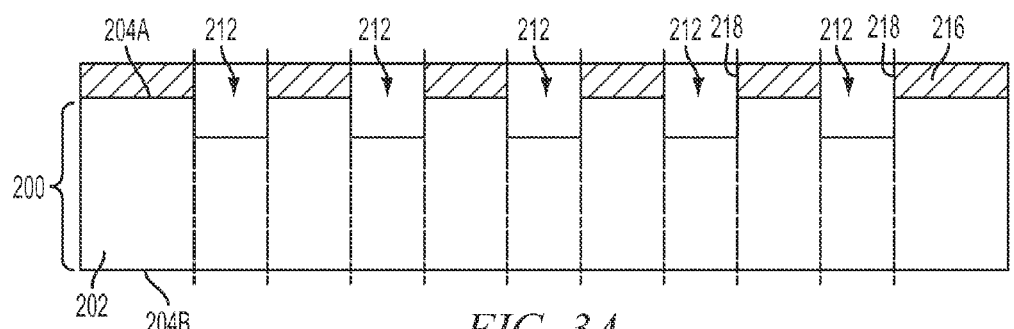
FIGS. 3A and 3B are simplified, schematically illustrated cross-sectional views illustrating processing of a donor structure in accordance with some embodiments of methods of the disclosure, wherein ions are implanted through selected regions of the donor structure that include dielectric material in recesses formed in the donor structure.

In additional embodiments, methods like those described above with reference to FIGS. 2A through 2G may be performed wherein the ion implantation process is performed after forming recesses in the donor structure, and after filling the recesses with dielectric material. For example, FIG. 3A illustrates a donor structure 200 like the donor structure 150 shown in FIG. 2A. The donor structure 200 comprises a bulk material 202, and has a first major surface 204A and an opposing second major surface 204B. As described in relation to the donor structure 150, a plurality of recesses 212 may be formed into the first major surface 204A of the donor structure 200.

The recesses 212 may be formed in the donor structure 200 using, for example, a masking and etching process. For example, a patterned mask 216 may be formed by depositing an oxide material, a nitride material, or an oxynitride material over the major surface 204A of the donor structure 200. A photolithography process then may be used to form apertures 218 through the mask 216. For example, a patterned photomask may be deposited over the material used to form the mask 216, and an etching process may be used to etch the apertures 218 in the mask 216 using the patterned photomask, after which the photomask may be removed. The patterned mask 216 then may be used to form the recesses 212 in the donor structure 200.

Figure 3B:
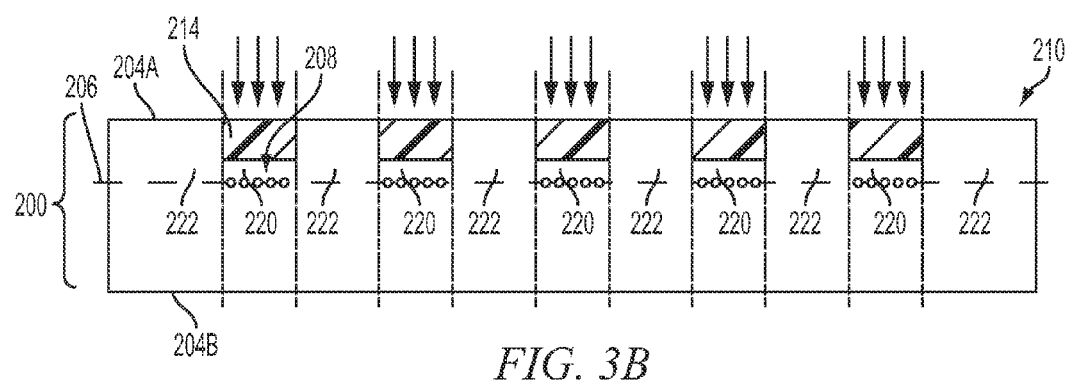

Referring to FIG. 3B, a dielectric material 214 may be provided in the recesses 212, as previously described in relation to the dielectric material 165 of FIG. 2C. The dielectric material 214 may be provided in the recesses 212 prior to implanting ions into the donor structure 200. Ions may be implanted through the recesses 212, and through the dielectric material 214 in the recesses 212, into the donor structure 200 generally along an ion implant plane 206 to define a generally planar zone of weakness within the donor structure 200. A layer of material 210 to be transferred from the donor structure 200 may be defined between the ion implant plane 206 and the first major surface 204A.

As previously described, ions may be implanted into a first plurality of regions 220 in the donor structure 200 without implanting ions into a second plurality of regions 222 in the donor structure 200. Defects 208 are illustrated along the ion implant plane 206 in the first plurality of regions 220. In some embodiments, the first plurality of regions 220 may comprise inactive regions of the donor structure 200, and the second plurality of regions 222 may comprise active regions in the donor structure 200. Although the mask 216 is not illustrated in FIG. 3B, in some embodiments, the same mask 216 used to form the recesses 212 may be used during the ion implantation process to form the inhomogeneous weakened zone along the ion implant plane 206. In other embodiments, a different mask may be used.

After implanting the ions as described above, the layer of material 210 may be transferred to a recipient structure using methods as previously described herein with reference to FIGS. 2D through 2G.

In the embodiments previously described, the generally planar weakened zone within the donor structure along the ion implant plane is rendered inhomogeneous by implanting ions through a first plurality of regions of the layer of material to be transferred without implanting ions through a second plurality of regions of the layer of material to be transferred. Other methods may be used to form an inhomogeneous weakened zone in accordance with embodiments of the disclosure. In additional embodiments, ions may be implanted through both a first plurality of regions and a second plurality of regions of the layer of material to be transferred, but either a concentration of ions, an elemental composition of ions, or both, within the regions may be caused to differ between the first plurality of regions and the second plurality of regions of the layer of material to be transferred.

Figure 4A:
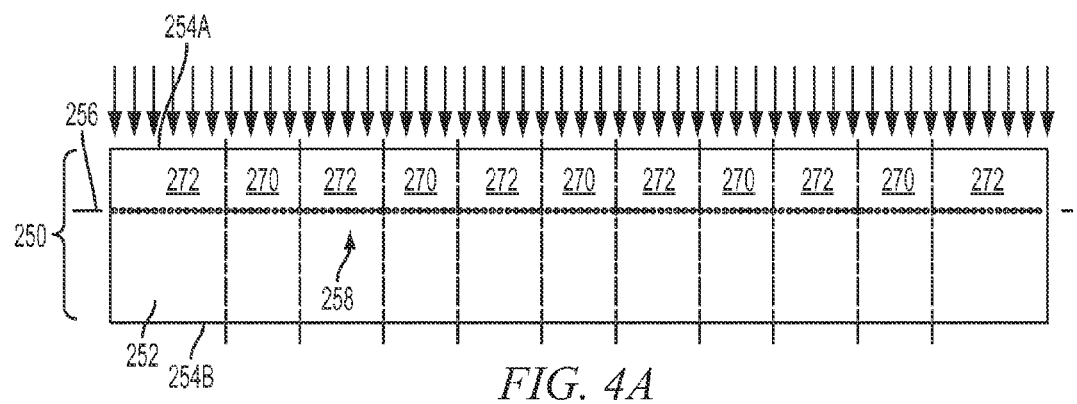
FIGS. 4A and 4B are simplified, schematically illustrated cross-sectional views illustrating processing of a donor structure in accordance with some embodiments of methods of the disclosure, wherein multiple ion implant processes are used to form an inhomogeneous ion implant plane within the donor structure.

For example, FIG. 4A illustrates a plurality of ions being implanted into a donor structure 250 along an ion implant plane 256 in a first ion implantation process. As previously described, the donor structure 250 may comprise a bulk material 252 and have a first major surface 254A and an opposing second major surface 254B. The ions may be homogeneously implanted into the donor structure 250, such that a first plurality of defects 258 are formed in a generally homogeneous manner across the ion implant plane 256 in both a first plurality of regions 270 and a second plurality of regions 272.

Figure 4B:
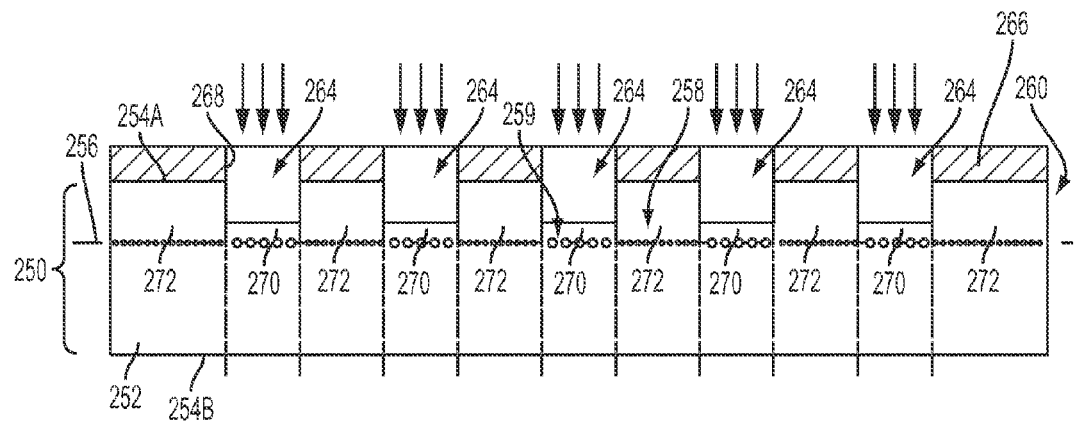

Referring to FIG. 4B, after the first ion implantation process, a second ion implantation process may be used to implant additional ions through the first plurality of regions 270 without implanting additional ions through the second plurality of regions 272. The ions may be implanted into the donor structure 250 through apertures 268 in a patterned mask 266, as previously described herein. The ions of the second ion implantation process may be of the same elemental composition or a different elemental composition relative to the ions of the first ion implantation process. As a result, additional defects 259 are formed along the ion implant plane 256 in the first plurality of regions 270 without forming the additional defects 259 in the second plurality of regions 272.

As shown in FIG. 4B, a plurality of recesses 264 optionally may be formed into the first major surface 254A of the donor structure 250 using, for example, a masking and etching process as previously described. The ions may be implanted through the recesses 264 into the first plurality of regions 270 (as shown in FIG. 4B) in a manner like that previously described with reference to FIG. 2A. In other embodiments, a dielectric material may be provided within the recesses 264 prior to the second ion implantation process, and the ions may be implanted through the dielectric material within the recesses 264 in a manner like that previously described with reference to FIG. 3B.

After the second ion implantation process, further processing may be carried out to transfer the layer of material 260 to a recipient structure using methods as previously described herein with reference to FIGS. 2C through 2G.

Figure 5A:
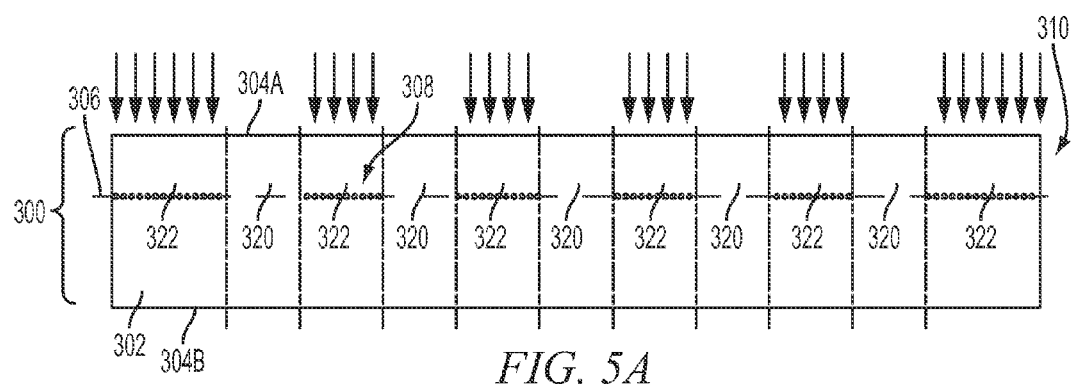
FIGS. 5A and 5B are simplified, schematically illustrated cross-sectional views illustrating processing of a donor structure in accordance with further embodiments of methods of the disclosure in which multiple ion implant processes are used to form an inhomogeneous ion implant plane within the donor structure.

In yet further embodiments, the first ion implantation process may comprise a selective, inhomogeneous ion implantation process like the second ion implantation process. For example, FIG. 5A illustrates a plurality of ions being implanted into a donor structure 300 along an ion implant plane 306 in a first ion implantation process. As previously described, the donor structure 300 may comprise a bulk material 302 and have a first major surface 304A and an opposing second major surface 304B. The ions may be inhomogeneously implanted into the donor structure 300, such that a first plurality of defects 308 are formed in a second plurality of regions 322 (which may comprise active regions) without implanting the ions into a first plurality of regions 320 (which may comprise inactive regions). Although not illustrated in FIG. 5A, the ions may be implanted into the second plurality of regions 322 within the donor structure 300 through apertures in a patterned mask, as previously described herein.

Figure 5B:
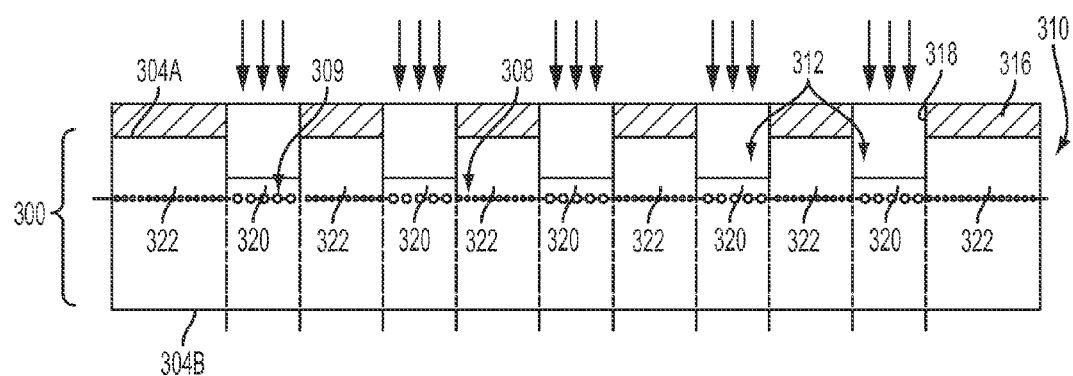

Referring to FIG. 5B, after the first selectively inhomogeneous ion implantation process, a second selectively inhomogeneous ion implantation process may be used to implant additional ions through the first plurality of regions 320 without implanting additional ions through the second plurality of regions 322. The ions may be implanted into the donor structure 300 through apertures 318 in a patterned mask 316, as previously described herein. The ions of the second ion implantation process may be of the same elemental composition or a different elemental composition relative to the ions of the first ion implantation process. As a result, additional defects 309 are formed along the ion implant plane 306 in the first plurality of regions 320 without forming such additional defects in the second plurality of regions 322. The second plurality of defects 309 may be more extensive and/or significant relative to the first plurality of defects 308, such that the weakened zone defined along the ion implant plane 306 is relatively weaker (more susceptible to fracture) in the first plurality of regions 320 than in the second plurality of regions 322.

As shown in FIG. 5B, a plurality of recesses 312 optionally may be formed into the first major surface 304A of the donor structure 300 using, for example, a masking and etching process as previously described. The ions may be implanted through the recesses 312 into the first plurality of regions 320 (as shown in FIG. 5B) in a manner like that previously described with reference to FIG. 2A. In other embodiments, a dielectric material may be provided within the recesses 312 prior to the second ion implantation process, and the ions may be implanted through the dielectric material within the recesses 312 in a manner like that previously described with reference to FIG. 3B.

After the second ion implantation process, further processing may be carried out to transfer the layer of material 310 to a recipient structure using methods as previously described herein with reference to FIGS. 2C through 2G.

Figure 6A:
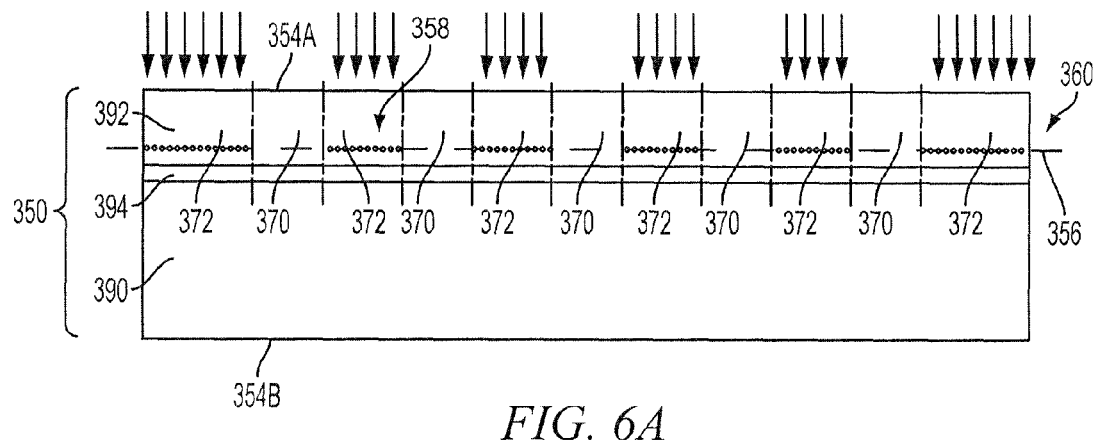
FIGS. 6A and 6B are simplified, schematically illustrated cross-sectional views illustrating processing of a donor structure in accordance with embodiments of methods of the disclosure wherein the donor structure comprises a semiconductor-on-insulator type structure.
Figure 6B:
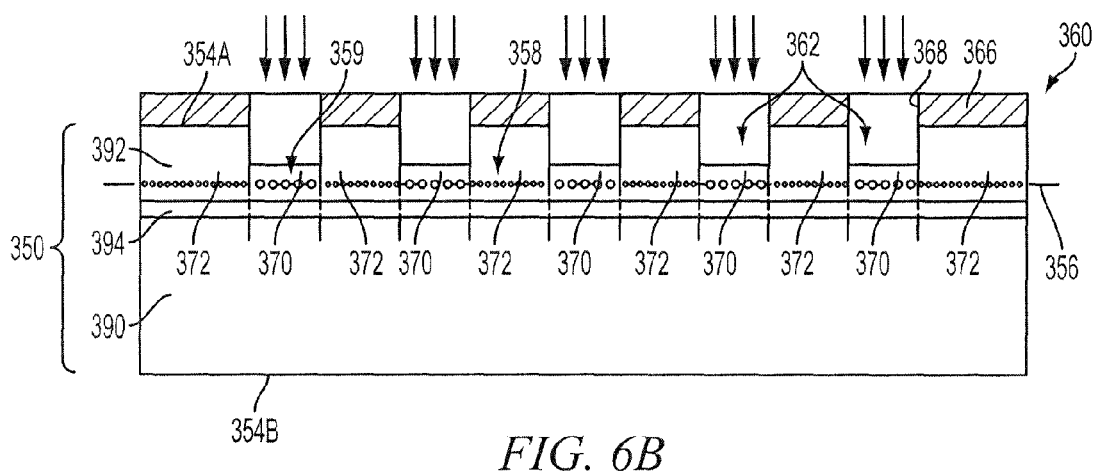

In any of the methods previously described herein, the donor structures optionally may comprise a semiconductor-on-insulator (SeOI) type substrate (e.g., a silicon-on-insulator (SOI) type substrate). For example, FIGS. 6A and 6B illustrate a method similar to that previously described with reference to FIGS. 5A and 5B, but wherein the donor structure comprises a semiconductor-on-insulator (SeOI) type substrate. Of course, any of the other methods described herein also may be carried out using semiconductor-on-insulator (SeOI) type substrates, as described below with reference to FIGS. 6A and 6B.

Referring to FIG. 6A, a donor structure 350 is shown that includes a base substrate 390 and a layer of semiconductor material 392 with a layer of dielectric material 394 therebetween. In other words, the layer of semiconductor material 392 is disposed on an opposing side of the layer of dielectric material 394 from the base substrate 390. The layer of dielectric material 394 may comprise what is referred to in the art as a "buried oxide layer" (BOL), and may comprise, for example, a ceramic material such as a nitride (silicon nitride (e.g., $Si_3N_4$)) or an oxide (e.g., silicon oxide ($SiO_2$) or aluminum oxide ($Al_2O_3$)). In some embodiments, the layer of dielectric material 394 may have a an average total thickness of about one micron (1 µm) or less, about five hundred nanometers (500 nm) or less, or even about three hundred nanometers (300 nm) or less. The layer of semiconductor material 392 may comprise, for example, silicon, germanium, a III-V semiconductor material (e.g., GaN, GaAs, InN, AlN, InGaN, etc.), or composites of such semiconductor materials.

The layer of semiconductor material 392 may be polycrystalline, or may comprise a single crystal of material. The base substrate 390 may comprise, for example, a ceramic material or a semiconductor material. In some embodiments, the base substrate 390 may have a composition at least substantially similar to that of the layer of semiconductor material 392. Like the previously described donor structures, the donor structure 350 has a first major surface 354A and an opposing second major surface 354B.

FIG. 6A illustrates a plurality of ions being implanted into the donor structure 350 along an ion implant plane 356 in a first ion implantation process. The ions may be inhomogeneously implanted into the donor structure 350, such that a first plurality of defects 358 are formed in a second plurality of regions 372 (which may comprise active regions) without implanting the ions into a first plurality of regions 370 (which may comprise inactive regions). Although not illustrated in FIG. 6A, the ions may be implanted into the second plurality of regions 372 within the donor structure 350 through apertures in a patterned mask, as previously described herein.

Referring to FIG. 6B, after the first selectively inhomogeneous ion implantation process, a second selectively inhomogeneous ion implantation process may be used to implant additional ions through the first plurality of regions 370 without implanting additional ions through the second plurality of regions 372. The ions may be implanted into the donor structure 350 through apertures 368 in a patterned mask 366, as previously described herein. The ions of the second ion implantation process may be of the same elemental composition or a different elemental composition relative to the ions of the first ion implantation process. As a result, additional defects 359 are formed along the ion implant plane 356 in the first plurality of regions 370 without forming such additional defects in the second plurality of regions 372. The second plurality of defects 359 may be more extensive and/or significant relative to the first plurality of defects 358, such that the weakened zone defined along the ion implant plane 356 is relatively weaker (more susceptible to fracture) in the first plurality of regions 370 than in the second plurality of regions 372.

As shown in FIG. 6B, a plurality of recesses 362 optionally may be formed into the first major surface 354A of the donor structure 350 using, for example, a masking and etching process as previously described. The ions may be implanted through the recesses 362 into the first plurality of regions 370 (as shown in FIG. 6B) in a manner like that previously described with reference to FIG. 2A. In other embodiments, a dielectric material may be provided within the recesses 362 prior to the second ion implantation process, and the ions may be implanted through the dielectric material within the recesses 362 in a manner like that previously described with reference to FIG. 3B.

After the second ion implantation process, further processing may be carried out to transfer the layer of material 360 to a recipient structure using methods as previously described herein with reference to FIGS. 2C through 2G.

Figure 7A:
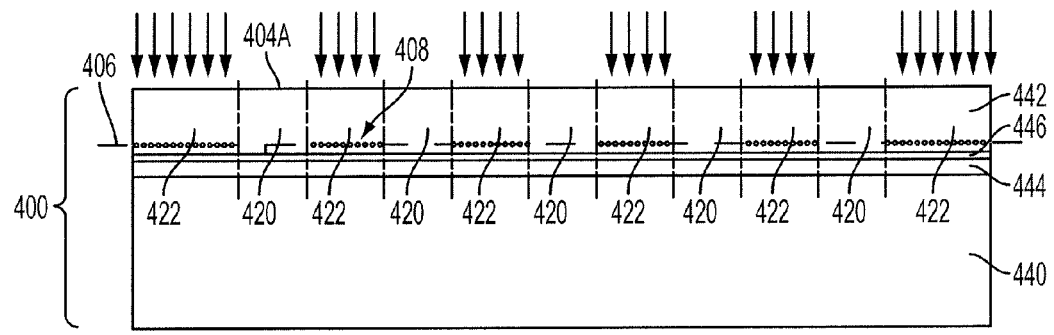
FIGS. 7A and 7B are simplified, schematically illustrated cross-sectional views illustrating processing of a donor structure in accordance with embodiments of methods of the disclosure wherein the donor structure comprises a semiconductor-on-insulator type structure and has an ion confinement layer therein.
Figure 7B:
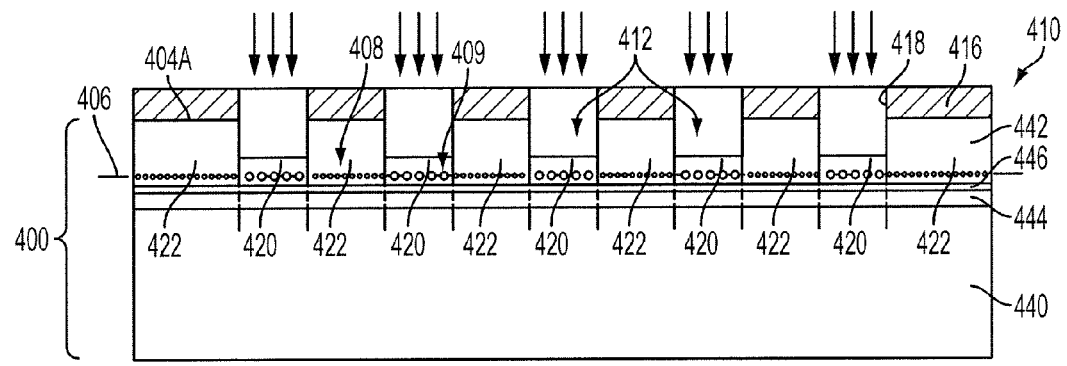

In any of the methods previously described herein, the donor structures optionally may include at least one ion confinement layer therein to assist in confining ions proximate the intended ion implant plane. For example, FIGS. 7A and 7B illustrate a method similar to that previously described with reference to FIGS. 6A and 6B, but wherein the donor structure further includes an ion confinement layer. Of course, any of the other methods described herein also may be carried out using a donor structure that includes an ion confinement layer, as described below with reference to FIGS. 7A and 7B.

Referring to FIG. 7A, a donor structure 400 is shown that comprises a semiconductor-on-insulator (SeOI) type substrate, which is substantially similar to that of FIG. 6A, and includes a base substrate 440, a layer of semiconductor material 442, and a layer of dielectric material 444 between the base substrate 440 and the layer of semiconductor material 442. The donor structure 400 also includes an ion confinement layer 446 disposed over the layer of dielectric material 444 on the side thereof on which the layer of semiconductor material 442 is disposed. In other words, the ion confinement layer 446 may be buried within the layer of semiconductor material 442, or it may be disposed between the layer of semiconductor material 442 and the layer of dielectric material 444.

The ion confinement layer 446 may comprise, for example, a portion of the layer of semiconductor material 442 that is doped with, for example, boron, carbon, or other elements prior to the ion implantation process used to form the generally weakened zone along the ion implant plane 406. The presence of the dopant elements may render the ion confinement layer 446 relatively less penetrable to the ions during the implantation process. In other embodiments, the ion confinement layer 446 may comprise a material (doped or undoped) that is different from that of the layer of semiconductor material 442, and relatively less penetrable to the ions to be implanted compared to the layer of semiconductor material 442.

FIG. 7A illustrates a plurality of ions being implanted into the donor structure 400 along an ion implant plane 406 in a first ion implantation process. The ions may be inhomogeneously implanted into the donor structure 400, such that a first plurality of defects 408 are formed in a second plurality of regions 422 (which may comprise active regions) without implanting the ions into a first plurality of regions 420 (which may comprise inactive regions). Although not illustrated in FIG. 7A, the ions may be implanted into the second plurality of regions 422 within the donor structure 400 through apertures in a patterned mask, as previously described herein.

Referring to FIG. 7B, after the first selectively inhomogeneous ion implantation process, a second selectively inhomogeneous ion implantation process may be used to implant additional ions through the first plurality of regions 420 without implanting additional ions through the second plurality of regions 422. The ions may be implanted into the donor structure 400 through apertures 418 in a patterned mask 416, as previously described herein. The ions of the second ion implantation process may be of the same elemental composition or a different elemental composition relative to the ions of the first ion implantation process. As a result, additional defects 409 are formed along the ion implant plane 406 in the first plurality of regions 420 without forming such additional defects in the second plurality of regions 422. The second plurality of defects 409 may be more extensive and/or significant relative to the first plurality of defects 408, such that the weakened zone defined along the ion implant plane 406 is relatively weaker (more susceptible to fracture) in the first plurality of regions 420 than in the second plurality of regions 422.

As shown in FIG. 7B, a plurality of recesses 412 optionally may be formed into the first major surface 404A of the donor structure 400 using, for example, a masking and etching process as previously described. The ions may be implanted through the recesses 412 into the first plurality of regions 420 (as shown in FIG. 7B) in a manner like that previously described with reference to FIG. 2A. In other embodiments, a dielectric material may be provided within the recesses 412 prior to the second ion implantation process, and the ions may be implanted through the dielectric material within the recesses 412 in a manner like that previously described with reference to FIG. 3B.

After the second ion implantation process, further processing may be carried out to transfer the layer of material 410 to a recipient structure using methods as previously described herein with reference to FIGS. 2C through 2G.

In any of the methods described herein wherein ions are implanted into a donor structure through recesses, dielectric sidewall spacers optionally may be provided within the recesses in the donor structure prior to implanting the ions into the donor structure through the recesses in an effort to prevent stray ions from entering into regions of the donor structure laterally adjacent the recesses. An example embodiment of such a method is described below with reference to FIGS. 8A through 8E.

Figure 8A:
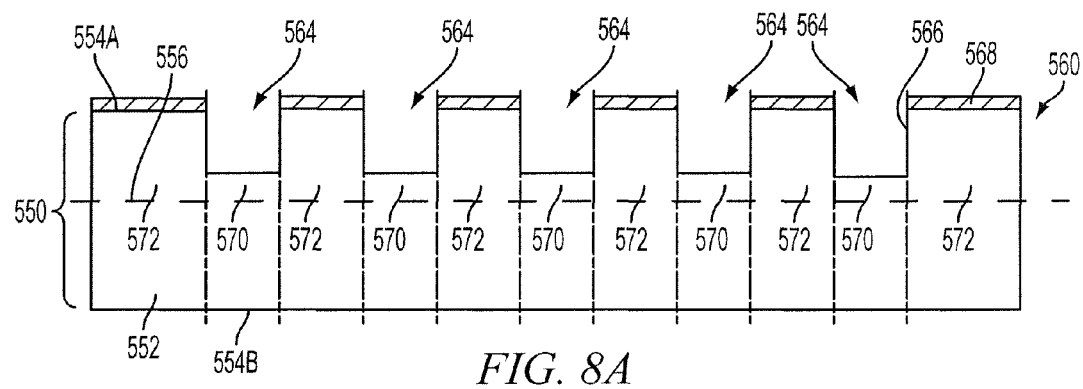
FIGS. 8A through 8E are simplified, schematically illustrated cross-sectional views illustrating processing of a donor structure in accordance with embodiments of methods of the disclosure wherein sidewall spacers are formed in recesses prior to implanting ions into the donor structure through the recesses.

Referring to FIG. 8A, a donor structure 550 is shown. The donor structure 550 is similar to the donor structure 150 of FIG. 2A, and includes a plurality of recesses 564 that have been formed into the bulk material 552 of the donor structure 550 through apertures 566 in a patterned mask 568. The patterned mask 568 may comprise, for example, a layer of nitride material such as silicon nitride ($Si_3N_4$). The bulk material 552 may have a first major surface 554A and an opposing second major surface 554B. The recesses 564 may be formed into the first major surface 554A, as shown in FIG. 8A.

Figure 8B:
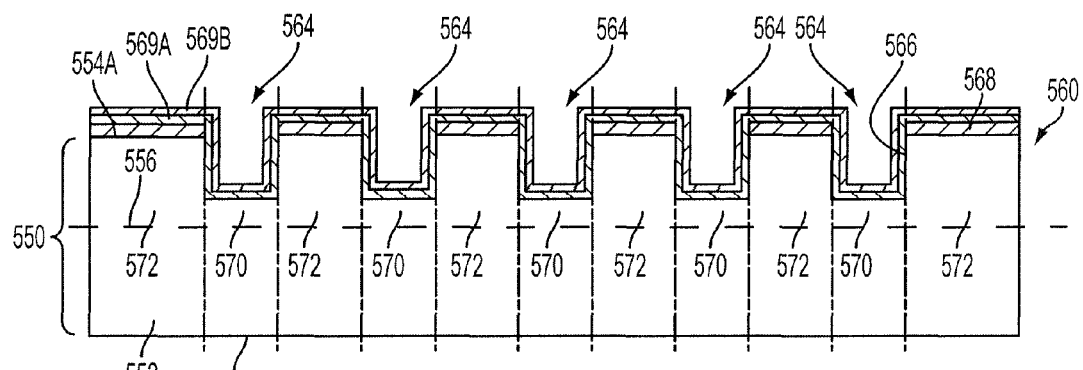

Referring to FIG. 8B, after forming the recesses 564, one or more conformal layers of material may be deposited over the mask 568 and the first major surface 554A of the bulk material 552, including on the exposed lateral side wall surfaces and the bottom surfaces within the recesses 564. The one or more conformal layers of material may comprise, for example, a layer or layers of dielectric material. For example, a first conformal layer 569A may be deposited on the mask 568 and the exposed surfaces of the bulk material 552 within the recesses 564, and a second conformal layer 569B may be deposited on the first conformal layer 569A, as shown in FIG. 8B. The second conformal layer 569B may have a material composition differing from that of the first conformal layer 569A so as to allow the second conformal layer 569B to be selectively etched without etching the first conformal layer 569A, as discussed below. As non-limiting examples, the first conformal layer 569A may comprise, for example, an oxide material such as silicon oxide ($SiO_2$), and the second conformal layer 569B may comprise, for example, a nitride material such as silicon nitride ($Si_3N_4$).

Figure 8C:
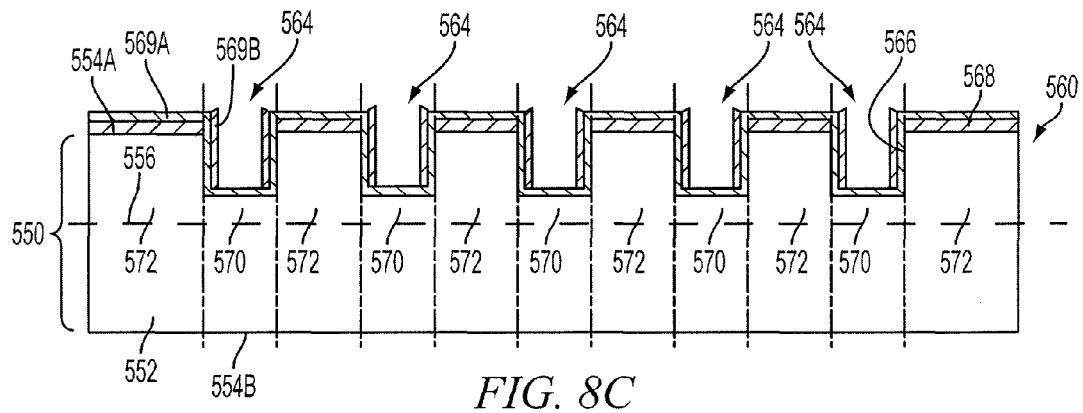

As shown in FIG. 8C, an anisotropic etching process may be used to etch the second conformal layer 569B, which may comprise nitride, such that the laterally extending regions of the second conformal layer 569B are removed without substantially removing the vertically extending regions of the second conformal layer 569B. Thus, as shown in FIG. 8C, only the regions of the second conformal layer 569B that are disposed on the lateral sidewalls within the recesses 564 remain, and the first conformal layer 569A is exposed at the bottom surfaces within the recesses 564 and over the major surface 554A of the donor structure 550. By way of example and not limitation, a dry plasma etching process (e.g., a reactive ion etching (RIE) process) may be used to anisotropically etch the second conformal layer 569B.

Figure 8D:
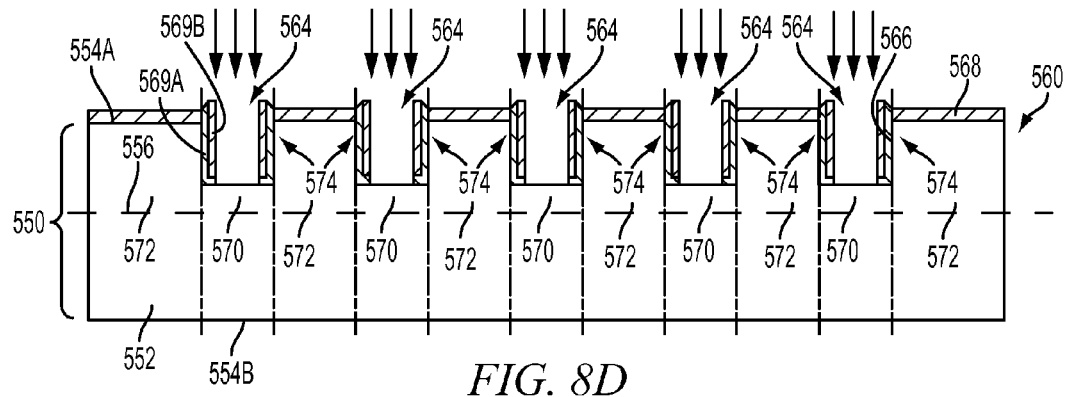

After anisotropically etching the second conformal layer 569B, another etching process may be used to remove the portions of the first conformal layer 569A (which may comprise an oxide) that are exposed at the bottom surfaces within the recesses 564. For example, a wet chemical etching process may be used to etch the exposed regions of the first conformal layer 569A, resulting in the structure shown in FIG. 8D. The etching process may also remove the regions of the first conformal layer 569A that overlie the first major surface 554A of the donor structure 550. As shown in FIG. 8D, the bulk material 552 is exposed at the bottoms of the recesses 564. Upon exposing the bulk material 552 is exposed at the bottoms of the recesses 564, spacer structures 574 may remain on the lateral sidewalls within the recesses 564 as shown in FIG. 8D. These spacer structures 574 may comprise portions of the one or more conformal layers 569A, 569B.

Thus, after exposing the bulk material 552 at the bottoms of the recesses 564, a plurality of ions may be implanted into the donor structure 550 along an ion implant plane 556. The ions may be inhomogeneously implanted into the donor structure 550, such that defects are formed in a first plurality of regions 570 (which may comprise inactive regions) without implanting the ions into a second plurality of regions 572 (which may comprise active regions). During the ion implantation process, the spacer structures 574 may further prevent ions from entering the second plurality active regions 572 of the layer of material 560 to be transferred through the sidewalls within the recesses 564.

Figure 8E:
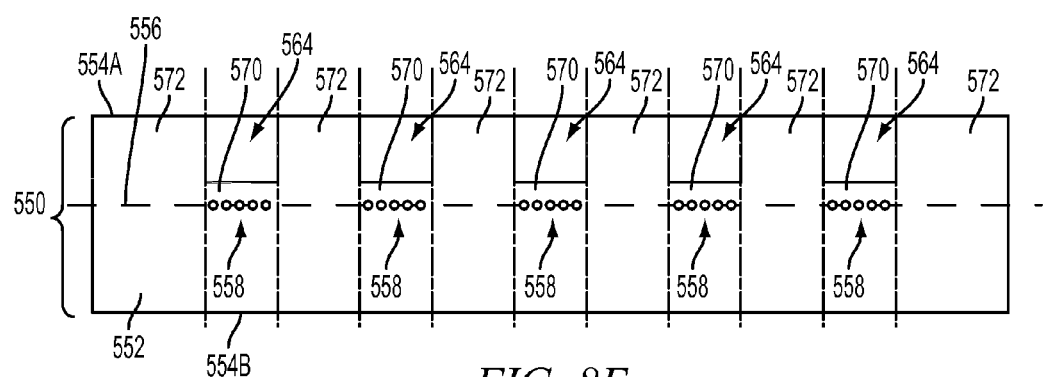

Referring to FIG. 8E, the implanted ions may result in the formation of defects 558 along the ion implant plane 556 in the first plurality of regions 570. After the ion implantation process, remaining portions of the one or more conformal layers 569A, 569B (e.g., the spacer structures 574) and the mask 568 (FIG. 8D) may be removed from the donor structure 550 using, for example, one or more of an etching process and a chemical-mechanical polishing (CMP) process to form the structure shown in FIG. 8E. The structure shown in FIG. 8E is generally similar to that of FIG. 2B, and may be further processed as previously described herein with reference to FIGS. 2C through 2G. Spacer structures, like the spacer structures 574 of FIG. 8D, may also be formed and employed in any of the methods described herein with reference to FIGS. 3A and 3B, 4A and 4B, 5A and 5B, 6A and 6B, and 7A and 7B.

Additional, non-limiting example embodiments of the disclosure are set forth below.

Embodiment 1

A method of transferring a layer of semiconductor material from a first donor structure to a second structure, comprising: implanting ions into the first donor structure to form a generally planar weakened zone within the first donor structure defined by the implanted ions, the generally planar weakened zone separating the layer of semiconductor material of the first donor structure from a remainder of the first donor structure, wherein at least one of a concentration of the implanted ions and an elemental composition of the implanted ions varies across the generally planar weakened zone in at least one direction parallel to the generally planar weakened zone; bonding the first donor structure to the second structure; and fracturing the first donor structure along the generally planar weakened zone and leaving the layer of semiconductor material bonded to the second structure.

Embodiment 2

The method of Embodiment 1, wherein implanting ions into the first donor structure to form the generally planar weakened zone comprises: implanting a relatively higher concentration of ions into the first donor structure through a first plurality of regions of the layer of semiconductor material; and implanting a relatively lower concentration of ions into the first donor structure through a second plurality of regions of the layer of semiconductor material.

Embodiment 3

The method of Embodiment 2, further comprising: selecting the first plurality of regions of the layer of semiconductor material to comprise inactive regions of the layer of semiconductor material; and selecting the second plurality of regions of the layer of semiconductor material to comprise active regions of the layer of semiconductor material.

Embodiment 4

The method of any one of Embodiments 1 through 3, wherein implanting ions into the first donor structure to form the generally planar weakened zone comprises: implanting ions of a first elemental composition into the first donor structure through a first plurality of regions of the layer of semiconductor material; and implanting ions of a different second elemental composition into the first donor structure through a second plurality of regions of the layer of semiconductor material.

Embodiment 5

The method of Embodiment 4, further comprising: selecting the first plurality of regions of the layer of semiconductor material to comprise inactive regions of the layer of semiconductor material; and selecting the second plurality of regions of the layer of semiconductor material to comprise active regions of the layer of semiconductor material.

Embodiment 6

The method of any one of Embodiments 1 through 5, wherein implanting the ions into the first donor structure comprises implanting the ions into the first donor structure through apertures in a patterned mask.

Embodiment 7

The method of Embodiment 6, further comprising forming the patterned mask on the first donor structure prior to implanting the ions into the first donor structure.

Embodiment 8

The method of any one of Embodiments 1 through 7, further comprising: forming recesses in a major surface of the first donor structure prior to implanting ions into the first donor structure; and wherein implanting the ions into the first donor structure comprises implanting ions into the first donor structure through surfaces of the first donor structure within the recesses without implanting ions into non-recessed areas of the major surface of the first donor structure.

Embodiment 9

The method of Embodiment 8, further comprising forming spacer structures on lateral sidewalls within the recesses prior to implanting the ions into the first donor structure.

Embodiment 10

The method of any one of Embodiments 1 through 6, wherein implanting the ions into the first donor structure comprises: performing one ion implantation process to implant a first quantity of ions into the first donor structure at a substantially homogeneous concentration across the first donor structure within the generally planar weakened zone; and performing another ion implantation process to implant a second quantity of ions into the first donor structure at a varying concentration across the first donor structure within the generally planar weakened zone.

Embodiment 11

The method of Embodiment 10, further comprising: forming recesses in a major surface of the first donor structure after performing the one ion implantation process to implant the first quantity of ions into the first donor structure; and wherein performing the another ion implantation process comprises implanting the second quantity of ions into the first donor structure through surfaces of the first donor structure within the recesses without implanting the second quantity of ions into non-recessed areas of the major surface of the first donor structure.

Embodiment 12

The method of Embodiment 11, further comprising forming spacer structures on lateral sidewalls within the recesses prior to implanting the second quantity of ions into the first donor structure.

Embodiment 13

The method of any one of Embodiments 1 through 12, further comprising selecting the first donor structure to comprise a semiconductor-on-insulator substrate.

Embodiment 14

The method of any one of Embodiments 1 through 13, further comprising forming at least one ion confinement layer in the first donor structure prior to implanting the ions into the first donor structure to form the generally planar weakened zone.

Embodiment 15

A method of fabricating a semiconductor device, comprising: transferring a layer of semiconductor material from a first donor structure to a second structure, comprising: implanting ions into the first donor structure to form a generally planar weakened zone within the first donor structure defined by the implanted ions, the generally planar weakened zone separating a layer of semiconductor material of the first donor structure from a remainder of the first donor structure, wherein at least one of a concentration of the implanted ions and an elemental composition of the implanted ions varies across the generally planar weakened zone in at least one direction parallel to the generally planar weakened zone; bonding the first donor structure to the second structure; and fracturing the first donor structure along the generally planar weakened zone and leaving the layer of semiconductor material bonded to the second structure; and fabricating a plurality of active device structures on the transferred layer of semiconductor material.

Embodiment 16

The method of Embodiment 15, wherein implanting the ions into the first donor structure to form the generally planar weakened zone within the first donor structure comprises implanting the ions through active regions of the layer of semiconductor material and through inactive regions of the layer of semiconductor material, wherein at least one of a concentration of the implanted ions and an elemental composition of the implanted ions varies between the active regions of the layer of semiconductor material and the inactive regions of the layer of semiconductor material.

Embodiment 17

The method of Embodiment 15 or Embodiment 16, wherein implanting the ions into the first donor structure comprises implanting the ions into the first donor structure through apertures in a patterned mask.

Embodiment 18

The method of any one of Embodiments 15 through 17, further comprising: forming recesses in a major surface of the first donor structure prior to implanting ions into the first donor structure; and wherein implanting the ions into the first donor structure comprises implanting ions into the first donor structure through surfaces of the first donor structure within the recesses without implanting ions into non-recessed areas of the major surface of the first donor structure.

Embodiment 19

The method of Embodiment 18, further comprising forming spacer structures on lateral sidewalls within the recesses prior to implanting the ions into the first donor structure.

Embodiment 20

The method of any one of Embodiments 15 through 17, wherein implanting the ions into the first donor structure comprises: performing one ion implantation process to implant a first quantity of ions into the first donor structure at a substantially homogeneous concentration across the first donor structure within the generally planar weakened zone; and performing another ion implantation process to implant a second quantity of ions into the first donor structure at a varying concentration across the first donor structure within the generally planar weakened zone.

Embodiment 21

The method of Embodiment 20, further comprising: forming recesses in a major surface of the first donor structure after performing the one ion implantation process to implant the first quantity of ions into the first donor structure; and wherein performing the another ion implantation process comprises implanting the second quantity of ions into the first donor structure through surfaces of the first donor structure within the recesses without implanting the second quantity of ions into non-recessed areas of the major surface of the first donor structure.

Embodiment 22

The method of Embodiment 21, further comprising forming spacer structures on lateral sidewalls within the recesses prior to implanting the second quantity of ions into the first donor structure.

Embodiment 23

A semiconductor structure, comprising: a first donor structure having a generally planar weakened zone therein defined by implanted ions within the first donor structure along the generally planar weakened zone, the generally planar weakened zone separating a layer of semiconductor material of the first donor structure from a remainder of the first donor structure, at least one of a concentration of the implanted ions and an elemental composition of the implanted ions varying across the generally planar weakened zone in at least one direction parallel to the generally planar weakened zone; and a second structure bonded to the layer of semiconductor material of the first donor structure.

Embodiment 24

The semiconductor structure of Embodiment 23, wherein the generally planar weakened zone comprises a first plurality of regions having a first concentration of the implanted ions therein, and a second plurality of regions having a second concentration of the implanted ions therein, the second concentration being higher than the first concentration.

Embodiment 25

The semiconductor structure of Embodiment 23 or Embodiment 24, wherein the generally planar weakened zone comprises a first plurality of regions in which the implanted ions therein have a first elemental composition, and a second plurality of regions in which the implanted ions therein have a second elemental composition differing from the first elemental composition.

Embodiment 26

The semiconductor structure of any one of Embodiments 23 through 25, further comprising recesses within the first donor structure, wherein at least one of a concentration of the implanted ions and an elemental composition of the implanted ions differs in regions within the generally planar weakened zone vertically over the recesses relative to regions within the generally planar weakened zone vertically over spaces in the first donor structure laterally between the recesses.

Embodiment 27

The semiconductor structure of Embodiment 26, further comprising spacer structures on lateral sidewalls within the recesses.

Embodiment 28

The semiconductor structure of any one of Embodiments 23 through 27, wherein the first donor structure comprises a semiconductor-on-insulator substrate.

Embodiment 29

The semiconductor structure of any one of Embodiments 23 through 28, further comprising at least one ion confinement layer in the first donor structure extending generally parallel to the generally planar weakened zone.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A method of transferring a layer of semiconductor material from a first donor structure to a second structure, comprising:
    implanting ions into the first donor structure to form a generally planar weakened zone within the first donor structure defined by the implanted ions, the generally planar weakened zone separating the layer of semiconductor material of the first donor structure from a remainder of the first donor structure, implanted ions and an elemental composition of the implanted ions varies across the implanting ions into the first donor structure to form the generally planar weakened zone further including:
        implanting a first concentration of ions into the first donor structure through a first plurality of regions of the layer of semiconductor material; and
        implanting a second concentration of ions into the first donor structure through a second plurality of regions of the layer of semiconductor material, the first concentration of ions being higher than the second concentration of ions;
    bonding the first donor structure to the second structure; and
    fracturing the first donor structure along the generally planar weakened zone and leaving the layer of semiconductor material bonded to the second structure.

2. The method of claim 1, further comprising:
    selecting the first plurality of regions of the layer of semiconductor material to comprise inactive regions of the layer of semiconductor material; and
    selecting the second plurality of regions of the layer of semiconductor material to comprise active regions of the layer of semiconductor material.

3. The method of claim 1, wherein implanting ions into the first donor structure to form the generally planar weakened zone comprises:
    implanting ions of a first elemental composition into the first donor structure through a first plurality of regions of the layer of semiconductor material; and
    implanting ions of a different second elemental composition into the first donor structure through a second plurality of regions of the layer of semiconductor material.

4. The method of claim 3, further comprising:
    selecting the first plurality of regions of the layer of semiconductor material to comprise inactive regions of the layer of semiconductor material; and
    selecting the second plurality of regions of the layer of semiconductor material to comprise active regions of the layer of semiconductor material.

5. The method of claim 1, wherein implanting the ions into the first donor structure comprises implanting the ions into the first donor structure through apertures in a patterned mask.

6. The method of claim 5, further comprising forming the patterned mask on the first donor structure prior to implanting the ions into the first donor structure.

7. The method of claim 1, further comprising:
forming recesses in a major surface of the first donor structure prior to implanting ions into the first donor structure; and
wherein implanting the ions into the first donor structure comprises implanting ions into the first donor structure through surfaces of the first donor structure within the recesses without implanting ions into non-recessed areas of the major surface of the first donor structure.

8. The method of claim 7, further comprising forming spacer structures on lateral sidewalls within the recesses prior to implanting the ions into the first donor structure.

9. The method of claim 1, wherein implanting the ions into the first donor structure comprises:
performing one ion implantation process to implant a first quantity of ions into the first donor structure at a substantially homogeneous concentration across the first donor structure within the generally planar weakened zone; and
performing another ion implantation process to implant a second quantity of ions into the first donor structure at a varying concentration across the first donor structure within the generally planar weakened zone.

10. The method of claim 9, further comprising:
forming recesses in a major surface of the first donor structure after performing the one ion implantation process to implant the first quantity of ions into the first donor structure; and
wherein performing the another ion implantation process comprises implanting the second quantity of ions into the first donor structure through surfaces of the first donor structure within the recesses without implanting the second quantity of ions into non-recessed areas of the major surface of the first donor structure.

11. The method of claim 10, further comprising forming spacer structures on lateral sidewalls within the recesses prior to implanting the second quantity of ions into the first donor structure.

12. The method of claim 1, further comprising selecting the first donor structure to comprise a semiconductor-on-insulator substrate.

13. The method of claim 1, further comprising forming at least one ion confinement layer in the first donor structure prior to implanting the ions into the first donor structure to form the generally planar weakened zone.

14. A method of fabricating a semiconductor device, comprising:
transferring a layer of semiconductor material from a first donor structure to a second structure, comprising:
implanting ions into the first donor structure to form a generally planar weakened zone within the first donor structure defined by the implanted ions, the generally planar weakened zone separating a layer of semiconductor material of the first donor structure from a remainder of the first donor structure, wherein implanting the ions into the first donor structure to form the generally planar weakened zone within the first donor structure comprises implanting the ions through active regions of the layer of semiconductor material and through inactive regions of the layer of semiconductor material, wherein at least one of a concentration of the implanted ions and an elemental composition of the implanted ions varies between the active regions of the layer of semiconductor material and the inactive regions of the layer of semiconductor material;
bonding the first donor structure to the second structure; and
fracturing the first donor structure along the generally planar weakened zone and leaving the layer of semiconductor material bonded to the second structure; and
fabricating a plurality of active device structures on the transferred layer of semiconductor material.

15. The method of claim 14, wherein implanting the ions into the first donor structure comprises implanting the ions into the first donor structure through apertures in a patterned mask.

16. The method of claim 14, further comprising:
forming recesses in a major surface of the first donor structure prior to implanting ions into the first donor structure; and
wherein implanting the ions into the first donor structure comprises implanting ions into the first donor structure through surfaces of the first donor structure within the recesses without implanting ions into non-recessed areas of the major surface of the first donor structure.

17. The method of claim 16, further comprising forming spacer structures on lateral sidewalls within the recesses prior to implanting the ions into the first donor structure.

18. The method of claim 14, wherein implanting the ions into the first donor structure comprises:
performing one ion implantation process to implant a first quantity of ions into the first donor structure at a substantially homogeneous concentration across the first donor structure within the generally planar weakened zone; and
performing another ion implantation process to implant a second quantity of ions into the first donor structure at a varying concentration across the first donor structure within the generally planar weakened zone.

19. The method of claim 18, further comprising:
forming recesses in a major surface of the first donor structure after performing the one ion implantation process to implant the first quantity of ions into the first donor structure; and
wherein performing the another ion implantation process comprises implanting the second quantity of ions into the first donor structure through surfaces of the first donor structure within the recesses without implanting the second quantity of ions into non-recessed areas of the major surface of the first donor structure.

20. The method of claim 19, further comprising forming spacer structures on lateral sidewalls within the recesses prior to implanting the second quantity of ions into the first donor structure.

21. A semiconductor structure, comprising:
a first donor structure having a generally planar weakened zone therein defined by implanted ions within the first donor structure along the generally planar weakened zone, the generally planar weakened zone separating a layer of semiconductor material of the first donor structure from a remainder of the first donor structure, wherein the generally planar weakened zone comprises a first plurality of regions having a first concentration of the implanted ions therein, and a second plurality of regions having a second concentration of the implanted ions therein, the second concentration being higher than the first concentration; and
a second structure bonded to the layer of semiconductor material of the first donor structure.

22. The semiconductor structure of claim 21, wherein the generally planar weakened zone comprises a first plurality of regions in which the implanted ions therein have a first elemental composition, and a second plurality of regions in which the implanted ions therein have a second elemental composition differing from the first elemental composition.

23. The semiconductor structure of claim 21, further comprising recesses within the first donor structure, wherein at least one of a concentration of the implanted ions and an elemental composition of the implanted ions differs in regions within the generally planar weakened zone vertically over the recesses relative to regions within the generally planar weakened zone vertically over spaces in the first donor structure laterally between the recesses.

24. The semiconductor structure of claim 23, further comprising spacer structures on lateral sidewalls within the recesses.

25. The semiconductor structure of claim 21, wherein the first donor structure comprises a semiconductor-on-insulator substrate.

26. The semiconductor structure of claim 21, further comprising at least one ion confinement layer in the first donor structure extending generally parallel to the generally planar weakened zone.

* * * * *

UNITED STATES PATENT AND TRADEMARK OFFICE
CERTIFICATE OF CORRECTION

PATENT NO. : 8,673,733 B2
APPLICATION NO. : 13/246580
DATED : March 18, 2014
INVENTOR(S) : Mariam Sadaka et al.

It is certified that error appears in the above-identified patent and that said Letters Patent is hereby corrected as shown below:

In the claims:

CLAIM 1, COLUMN 22, LINES 20-22, change "structure, implanted ions and an elemental composition of the implanted ions varies across the implanting" to
--structure, implanting--

Signed and Sealed this
Twenty-ninth Day of December, 2015

Michelle K. Lee
*Director of the United States Patent and Trademark Office*